United States Patent [19]

Moriya et al.

[11] 4,377,438
[45] Mar. 22, 1983

[54] METHOD FOR PRODUCING SEMICONDUCTOR DEVICE

[75] Inventors: Takahiko Moriya, Yokosuka; Yoshikazu Hazuki, Yokohama; Masahiro Kashiwagi, Fujisawa, all of Japan

[73] Assignee: Tokyo Shibaura Denki Kabushiki Kaisha, Kawasaki, Japan

[21] Appl. No.: 304,677

[22] Filed: Sep. 22, 1981

[30] Foreign Application Priority Data

Sep. 22, 1980 [JP] Japan .................. 55-130754
Oct. 28, 1980 [JP] Japan .................. 55-150179

[51] Int. Cl.³ .............. H01L 21/306; B44C 1/22; C03C 15/00; C03C 25/06
[52] U.S. Cl. ................. 156/643; 156/646; 156/653; 156/657; 156/345; 204/192 E; 252/79.1; 427/38
[58] Field of Search .......... 427/38, 39; 156/643, 156/646, 653, 657, 662, 345; 204/164, 192 EC, 192 E, 298; 252/79.1

[56] References Cited

U.S. PATENT DOCUMENTS 3,940,506 2/1976 Heinecke .................. 427/38
4,073,054 2/1978 Kaji ...................... 29/580
4,222,792 9/1980 Lever et al. ............ 156/643 X

FOREIGN PATENT DOCUMENTS

5122912   Japan

OTHER PUBLICATIONS

Extended Abstracts of the Journal of Electrochemical Society, Vol. 77-2, Oct. 1977, 366-377
Heinecke, Solid State Electronics, Vol. 18, No. 12, Dec. 1975, pp. 1146-47
IBM Technical Disclosure Bulletin, Vol. 20, No. 4, Sep. 1977, pp. 1381-82.

*Primary Examiner*—William A. Powell
*Attorney, Agent, or Firm*—Oblon, Fisher, Spivak, McClelland & Maier

[57] ABSTRACT

A method for producing a semiconductor device has the steps of forming an insulating film on an uneven surface of a semiconductor body; and dry etching the insulating film by using as an etchant a gas containing carbon-halogen bonds and hydrogen, whereby the surface of said insulating film is smoothed.

12 Claims, 14 Drawing Figures

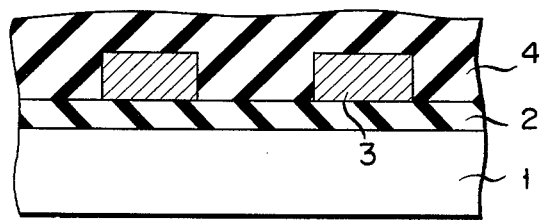
FIG. 4
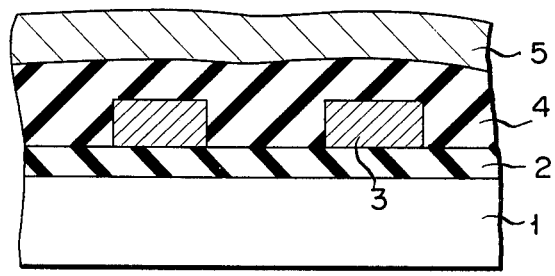
FIG. 5
FIG. 6
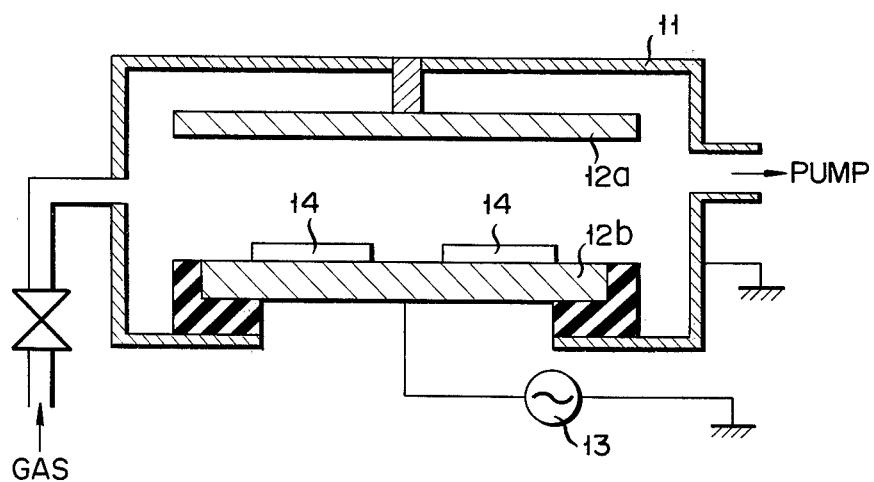

METHOD FOR PRODUCING SEMICONDUCTOR DEVICE

BACKGROUND OF THE INVENTION

The present invention relates to a method for producing a semiconductor device and, more particularly, to a method for smoothing an insulating layer.

Conventionally, in integrated circuits or the like, a plurality of insulating layers and conductive layers are deposited to form a multi-interconnection layer in order to increase the packaging density of the elements.

For example, formation of the multi-interconnection layer on a semiconductor substrate on which semiconductor elements are formed can be accomplished in the following manner. As shown in FIG. 1, a first insulating film 2 of silicon oxide or the like is deposited on a substrate 1 in order to insulate the substrate 1 and protect its surface. A contact hole is formed by photolithography at a portion of the first insulating layer 2 which is required for connection between the substrate 1 and a conductive layer to be formed on the first insulating film 2. A metal layer of conductive metal such as aluminum is deposited on the first insulating film 2 and the exposed part of the substrate 1 through the contact hole. This metal film is patterned by photolithography to form a first conductive layer 3. A second insulating film 4 of silicon oxide or the like is deposited on the first conductive film 3 by vapor growth method, high frequency sputtering or the like. A contact hole is then formed in the second insulating film 4 by photolithography, and a second conductive layer 5 which has a predetermined pattern is formed thereafter.

In such a method for forming a multi-interconnection layer, level differences caused by formation of the first conductive layer 3 and the contact hole formed in the second insulating film 4 tend to result in disconnection of the second conductive layer 5 at the sides of the stepped portion and in formation of pinholes and cracks in the second insulating film 4 where the first conductive layer 3 and the second conductive layer 5 meet. Further, the first and second conductive layers tend to short-circuit.

Further, when the pattern gap between the conductive layers 3 and 5 is made narrow or when the diameter of the contact hole in the second insulating film 4 between the conductive layers 3 and 5 is made less than 3 $\mu$m, abrupt level differences are formed at contact holes of the first conductive layer 3 and the second insulating film 4. In this way, when the pattern of the conductive layers is elaborate and the level differences are abrupt, the formed insulating film 4 becomes thin at the sides where the level differences are present as shown in FIG. 2, even if a reduced pressure vapor growth method or plasma vapor growth method utilizing glow discharge is used, which is a method for forming an insulating film having excellent coating characteristics. As a result, the voltage resistance between the conductive layers 3 and 5 is degraded and, in the worst case, the conductive layers 3 and 5 are short-circuited. When aluminum or the like is deposited on the second insulating film 4 by sputtering or the electron beam deposition method to form the second conductive layer; however, aluminum is not substantially deposited where level differences are present. Therefore, cracks or disconnections may form in the conductive layer 5 during annealing at a temperature of 450 to 550° C. performed to reduce connection resistance between the conductive layers 3 and 5. The conductive layer 5 may become disconnected due to the electro-migration effect. Due to these problems, an elaborate multi-interconnection layer cannot be achieved, the yield of the product decreases, and the occurance of troubles in service adversely increases.

In order to prevent disconnections of the conductive layers, a method is known in which the insulating film surface is smoothed before the second conductive layer is formed. For example, a glass layer made of phosphorus-doped $SiO_2$ is used as an insulating film, and annealing is performed at a temperature of not less than 1,000° C. to make the glass layer surface smooth from plastic flow. This method is the so-called glass flow method. However, according to the glass flow method, the acommpanying high-temperature annealing rules out low-melting-point metals such as aluminum for use as the first conductive layer. Further, impurities such as phoshorus, arsenic, and boron which are implanted into the semiconductor substrate become redistributed by the high temperature annealing, and the high packaging density and high speed of the semiconductor device are adversely affected.

Another method for smoothing the insulating film surface before forming the second conductive layer is known in which an $SiO_2$ film is formed on the first conductive layer of a predetermined pattern by the vapor growth method and then an organic substance such as organosilane is coated thereon, or the organic substance is coated on the first conductive layer and then the $SiO_2$ film is formed by the vapor growth method. However, according to this method, when an organic substance such as organosilane is calcined, the glass film becomes porous so that hygroscopicity becomes great. Further, since the organic substance remains, the insulation of the $SiO_2$ film is degraded. Since the organic substance is calcined at a temperature range of 450° to 500° C., cracks may be formed in the $SiO_2$ film and short circuiting between the conductive layers may occur. Further, when aluminum is used as a conductive layer, the hygroscopicity of the $SiO_2$ film is great as described above, and the aluminum layer may corrode and be disconnected due to the water content in the $SiO_2$ film.

For manufacturing dielectric isolation integrated circuit, grooves are formed on the surface of the semiconductor substrate to isolate a plurality of pocket regions. A dielectric material is filled in the grooves by means of selective oxidation. This method also has a drawback in that large protrusions are formed corresponding to the groove pattern, the protrusions assuming shapes such as birds' beaks or birds' heads. Instead of the selective oxidation method having the above-mentioned drawback, it is contemplated that an insulating material may be deposited within the grooves. However, since no effective method for forming a smooth insulating film on an uneven surface is proposed, great restrictions are imposed on forming a dielectric isolation in the transverse direction of the integrated circuit.

SUMMARY OF THE INVENTION

The object of the present invention is to provide a method for producing a semiconductor device in which a smooth insulating film surface can be formed.

According to the present invention, a method for producing a semiconductor device is provided comprising the steps of forming an insulating film on an uneven surface of a semiconductor body, and performing dry etching using a gas containing carbon-halogen bonds and hydrogen as an etchant, whereby the surface of said insulating film is smoothed.

BRIEF DESCRIPTION OF THE DRAWINGS

FIGS. 3 to 5 are sectional views illustrating a process of Example 1 according to the present invention;

FIG. 6 is a sectional view of an etching apparatus used in the respective examples;

DETAILED DESCRIPTION OF THE PREFERRED EMBODIMENTS

Figure 1:
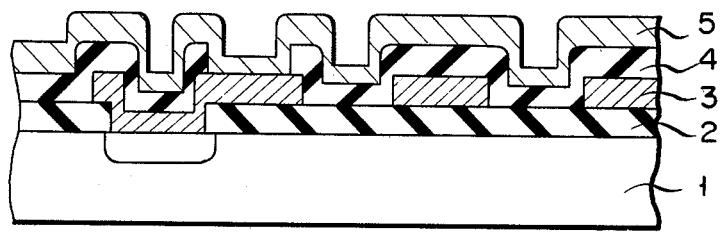
FIGS. 1 and 2 are sectional views of conventional multi-interconnection layers.

The present invention is based on the principle that an uneven surface of an insulating film is dry-etched with a gas containing carbon-halogen bonds and hydrogen as the etchant, so that the surface of the insulating film is smoothed.

Reactive ion etching, plasma etching, sputter etching, or chemical dry etching can be used for the dry etching employed for the present invention. Reactive ion etching is generally preferred.

The insulating film for smoothing is selected from a silicon nitride film; silicon oxide film; a glass film containing impurities such as phosphorus, boron and arsenic; a silicon oxynitride film; a metal oxide film; or a laminated film having at least two of these films.

The gas containing carbon-halogen bonds and hydrogen as the etchant may be a mixture of a gas of $CF_4$, $C_2F_6$, $C_3F_8$, $CCl_4$, $CH_3Br$ or the like with hydrogen gas. A $CHF_3$ gas which is different from the gas mixtures mentioned above may also be used. The hydrogen need not be contained in the etchant gas; hydrogen ions may be ion-implanted on the insulating film.

A silicon nitride film is preferred as the insulating film to be etched by the gas described above. The most preferable etchant gas for etching a silicon nitride film as the insulating film is a gas mixture of $CF_4$ and $H_2$. When a silicon oxide film is used as the insulating film, a gas mixture of $C_3F_8$ and $H_2$ is most preferable as the etchant gas.

When a mixture of a gas containing carbon-halogen bonds and hydrogen gas is used as the gas etchant, the volume of the hydrogen gas is preferably 20 to 40 volume % of the total volume of the gas mixture.

When an insulating film has an uneven surface which is hard to smooth by the dry etching described above, a second insulating film whose surface is easily smoothed by the method among those described above is formed, and the surface is smoothed by the dry etching. Thereafter, an etching method with which the etching rates of the two insulating films is substantially the same is used for etching the smoothed surface, and the second insulating film is completely removed.

The smoothing mechanism of the surface of the insulating film described above is not fully understood. However, this mechanism may be analyzed in the following manner. For example, when a gas mixture of $CF_4$ and $H_2$ is used as the gas etchant and reactive ion etching is performed on a silicon nitride film, $CF_3^+$ and $CF_2^+$ ions discharged in glow discharge due to the cathode voltage drop etch the projections on the silicon nitride film while a (C-F) polymer is attached to the recesses, so that etching of the silicon nitride film in the recesses is suppressed. $H_2$ reduces the relative volume of F to C, and production of the (C-F) polymer may be accelerated.

The method of the present invention as has been described is very effective for formation of multi-interconnection layers and dielectric isolation layers.

The present invention will now be described by way of its examples.

EXAMPLE 1

Figure 3:
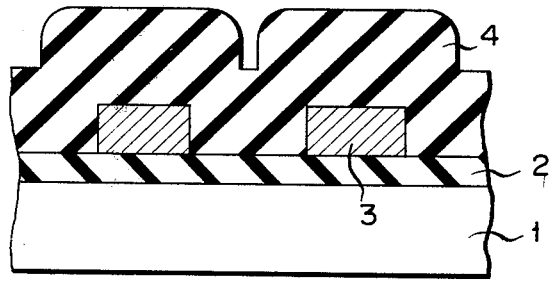

A silicon oxide film 2 is formed on a semiconductor substrate 1 on which elements are formed as shown in FIG. 3 by the vapor growth method. A contact hole (not shown) is formed in the silicon oxide film 2 and a conductive layer, for example, an aluminum film 3, is deposited over the silicon oxide film and the contact hole. The aluminum film is deposited by a method such as sputtering or electron beam deposition. Patterning of the aluminum film is performed by etching using a solution containing phosphoric acid as the major component, or by reactive ion etching using a gas mixture of $CCl_4$ and $Cl_2$. An insulating film, for example, a silicon nitride film 4, is formed on the aluminum wiring pattern by plasma vapor growth utilizing glow discharge with a gas mixture of $SiH_4$ and $NH_3$. FIG. 3 is a section wherein an aluminum film pattern of about 1 $\mu$m thickness, about 2 $\mu$m width and about 2.5 $\mu$m spacing, and a silicon nitride film of about 2 $\mu$m thickness are formed on the semiconductor substrate.

Figure 7:
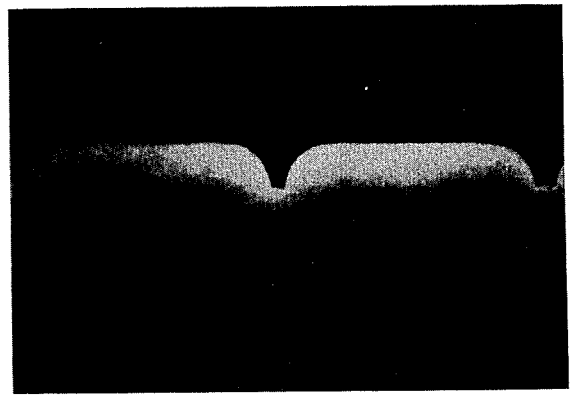
FIGS. 7 and 8 show photomicrographs illustrating sections of an insulation film before and after etching in the process according to the present invention.
Figure 8:
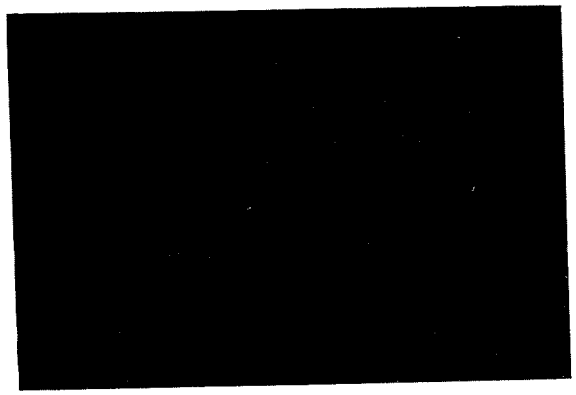

The surface layer of the silicon nitride film 4 is etched by about 1 $\mu$m by an anisotropic dry etching method such as reactive ion etching utilizing a gas mixture of $CF_4$ and $H_2$. The section in FIG. 4 shows the surface layer of the silicon nitride film 4. The reactive ion etching is performed by an apparatus as shown in FIG. 6. A workpiece 14 is placed on one electrode 12b of a pair of parallel, planar electrodes 12a and 12b which are mounted within an etching chamber 11. The electrode 12b is connected to a high frequency power generator 13. The workpiece is etched at a gas flow rate of 24 cc/min of $CF_4$ and 9 cc/min of $H_2$, at an RF power of 150 W, and at an internal pressure of the etching chamber of 0.01 Torr. The remaining surface of the silicon nitride film 4 in the etching chamber becomes substantially smooth. Smoothness is further achieved when more $H_2$ is used. This is because, when anisotropic dry etching is performed on the insulating film, the etching rate for regions in which narrow grooves are formed is much smaller than the etching rate for flat regions. FIGS. 7 and 8 show photomicrographs showing the section of the workpiece before and after etching. FIG. 7 shows the condition before etching, and FIG. 8 shows the condition after etching.

Subsequently, aluminum is deposited on the insulating film and the deposited aluminum layer is patterned to form an aluminum film 5.

Figure 2:
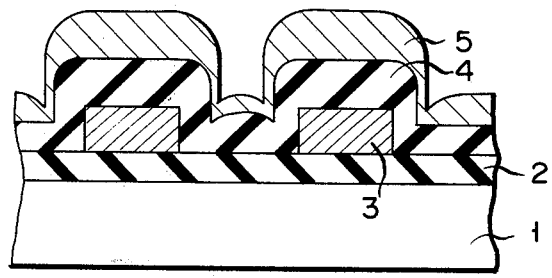

As is apparent from the comparison between FIG. 5 in which a multi-interconnection layer is formed according to the method of the present invention and FIG. 2 in which a multi-interconnection layer is formed by the conventional method, the thickness of the second conductive layer 5 becomes substantially uniform according to the present invention, so that cracks and disconnections in the conductive layer 5 can be prevented in the annealing at a temperature of 450° to 500° C. Further, disconnections caused by electro-migration are also prevented, and pin holes and cracks do not form since the thickness of the insulating film between conductive layers is sufficiently great even at portions where the first conductive layer 3 and the second conductive layer 5 overlap. Short circuiting between the conductive layers is prevented and the voltage resistance is not degraded, thus improving the reliability of a semiconductor device having the multi-interconnection layer.

According to the present invention, an organic glass material need not be used as an insulating film between the conductive layers, so that the reliability of the mutual insulation between the conductive layers is high and corrosion of the aluminum film is well prevented.

Further, according to the present invention, since the trouble such as cracks, disconnections, and the like does not occur at portions particularly when the wiring pattern is elaborate and level differences are abrupt, the multi-interconnection layer may be made even more elaborate and the packaging density of the elements is greatly improved.

Aluminum is used for forming the conductive layers. However, other materials such as molybdenum, tungsten, titanium, and platinum; silicates thereof; or polycrystalline silicon may also be used for the present invention.

In the above embodiment, the case in which the two conductive layers are formed is described. A multi-interconnection layer having three or more conductive layers may be formed by repeating the process described above. In this way, the present invention is very effective for forming a multi-interconnection layer.

In the above embodiment, the surface layer of the insulating film is removed by anisotropic dry etching, and the conductive layer is formed over the remaining insulating film. However, after removing the surface layer of the insulating film, an insulating film may be coated again thereover. Alternatively, a conductive layer may be formed on an insulating film, formed by repeating this process.

EXAMPLE 2

In this example, a silicon oxide film which is hard to smooth is used as the insulating film between the conductive layers, and smoothing of the silicon oxide film is performed.

Figure 9:
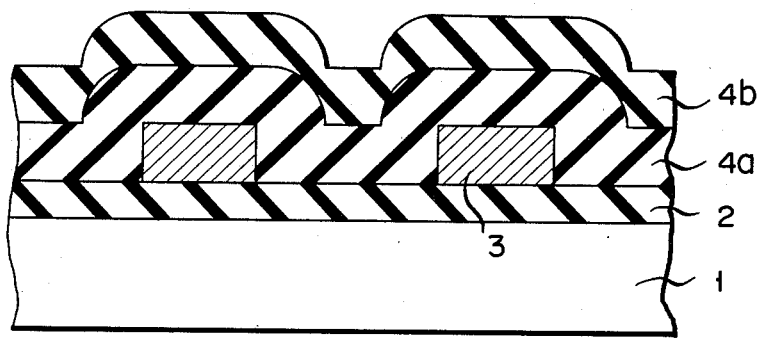
FIGS. 9 to 11 are sectional views illustrating a process of Example 2 according to the present invention.

As shown in FIG. 9, a silicon oxide film 2 is deposited by thermal oxidation on the substrate 1 on which elements are formed. A contact hole (not shown) is formed in the silicon oxide film 2 and the first conductive layer, the aluminum film 3 for example, is formed over the silicon oxide film and the contact hole by sputtering or electron beam deposition. It is patterned by reactive ion etching (RIE) by using a gas mixture of $CCl_4$ and $Cl_2$. A silicon oxide film 4a is then formed on the wiring pattern by the plasma vapor growth method utilizing glow discharge with $SiH_4$ gas and $N_2O$ gas. Further, a silicon nitride film 4b is formed thereon by the plasma vapor growth method using $SiH_4$ gas and $NH_3$ gas.

Referring to FIG. 9, a case is shown in which the aluminum film has about 1 $\mu$m thickness and about 2 $\mu$m width, the gap between the aluminum conductive wiring layers is about 3 $\mu$m, the silicon oxide film has about 1 $\mu$m thickness, and the silicon nitride film has about 1 $\mu$m thickness.

Figure 10:
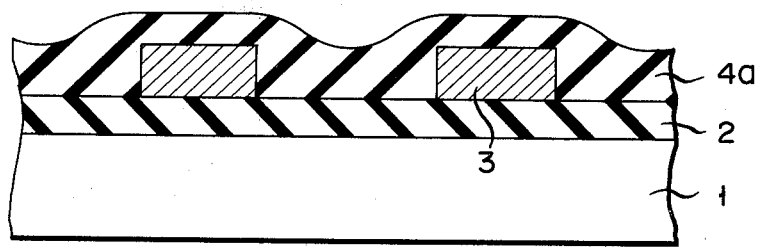

FIG. 10 shows a section of the substrate in which the silicon oxide film 4a becomes smooth after a thickness of 0.5 $\mu$m of the silicon oxide film 4a and a thickness of 1 $\mu$m of the silicon nitride film 4b are removed at the projections by the RIE method method using a gas mixture of $CF_4$ and hydrogen wherein the hydrogen concentration is 27%, that is, when the etching rates of silicon oxide and silicon nitride are substantially identical. Instead of this method of smoothening the silicon oxide film 4a, another method may be used. For example, reactive ion etching is conducted on the film 4b, thus smoothening the film 4b to a higher degree, using a gas mixture of $CF_4$ and $H_2$ wherein the hydrogen concentration is more than 27%, and then etching is conducted on the film 4a, thus smoothening the film 4a, using a gas mixture of $CF_4$ and $H_2$ wherein the hydrogen concentration is 27%.

Figure 12:
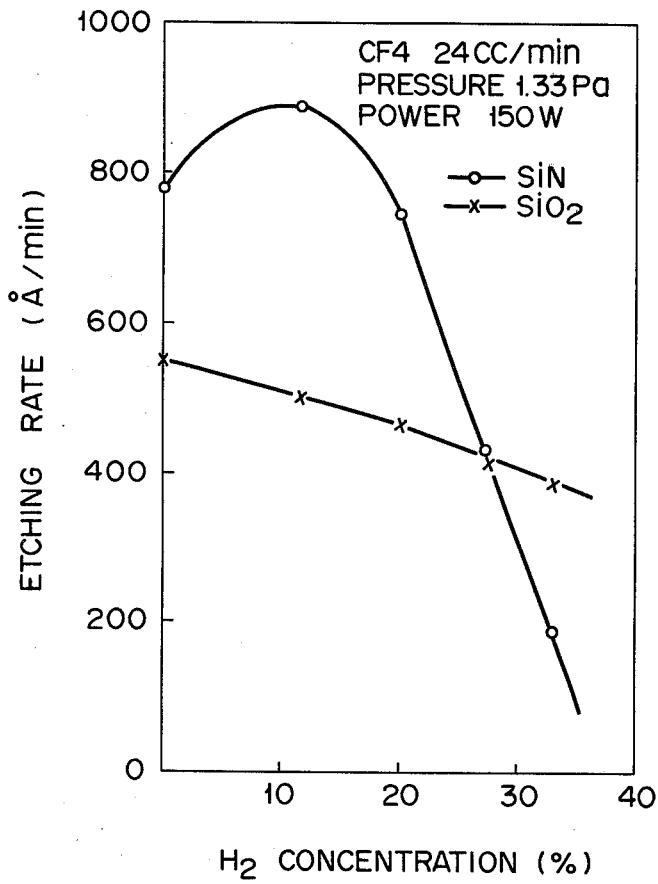
FIG. 12 is a graph illustrating changes in etching rate of a silicon nitride film and a silicon oxide film when $H_2$ gas is added at various concentrations to $CF_4$.

FIG. 12 shows how the hydrogen concentration affects the etching rates of silicon oxide and silicon nitride in the RIE method. The etching apparatus shown in FIG. 6 is set at a flow rate of $CF_4$ of 24 cc/min, at a pressure of 1.33 Pa (pascal), and at a high frequency power of 150 W. Referring to FIG. 12, when the hydrogen concentration increases, the etching rate of silicon oxide simply decreases, while the etching rate of silicon nitride increases slightly with an increase in the hydrogen concentration, and then abruptly decreases. When the hydrogen concentration is about 27%, both etching rates are substantially identical. The etching rates shown in FIG. 12 are the rates when the flat regions (projections) are etched. The etching rate of silicon nitride for recessed regions is lower than that for projecting regions. The rate difference becomes greater when the hydrogen concentration is increased.

In this way, a second conductive layer, for example, an aluminum film 5 as shown in FIG. 4 is formed on the insulating film 4a having a smooth surface by a method described above.

According to the present invention, in an arrangement having different types of insulating films, such as a multilayer consisting of silicon oxide and silicon nitride, only silicon oxide remains so that the recessed regions are smoothed, preventing disconnections of conductive layers and increasing the reliability of the semiconductor device. The present invention only requires the low temperature process, yet provides the same results as in the glass flow method requiring the high temperature process. Further, the present invention does not require an organic material so that corrosion of the conductive layers and current leakage between wirings are prevented.

Figure 11:
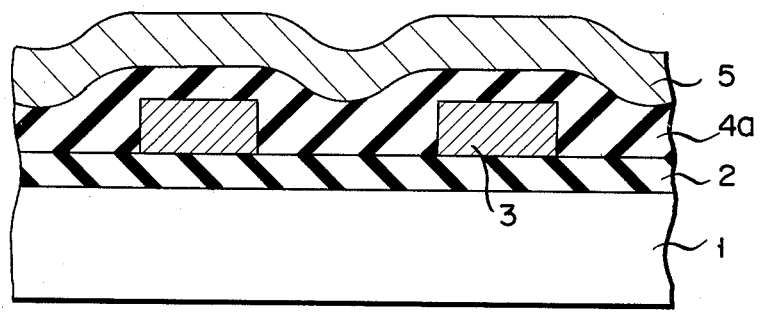

Referring to FIG. 11, the second conductive layer 5 is formed on the silicon oxide film 4a after etching. However, a silicon oxide film may be formed again on the silicon oxide film 4a after etching and before forming the second conductive layer 5.

EXAMPLE 3

Figure 13:
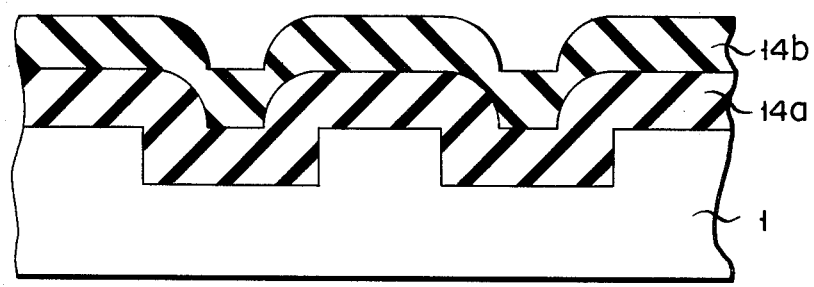
FIGS. 13 and 14 are sectional views illustrating a process of Example 3 according to the present invention.

Referring to FIG. 13, the silicon oxide film 4a is formed on the semiconductor substrate 1 having a groove pattern for dielectric isolation, and then the silicon nitride film 4b is formed thereon by the method used in the Example 1. FIG. 13 shows the condition in which the pattern grooves have about 1 μm depth and about 3 μm width, the silicon oxide film has about 1 μm thickness, and the silicon nitride film has about 1 μm thickness.

Figure 14:
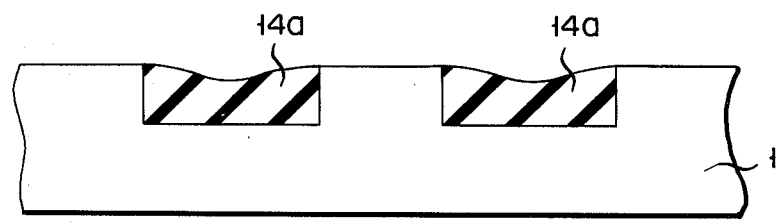

In the same manner as in Examples 1 and 2, at the projecting regions, the silicon nitride film 4b and the silicon oxide film 4a are removed by 1 μm and about 1 μm, respectively, by the RIE method using a gas mixture of Freon and hydrogen at a hydrogen concentration of 27%, that is, in the condition in which the etching rate of the silicon oxide is the same as that of the silicon nitride. As a result, the surface of the silicon oxide film 4a becomes smooth, as shown in FIG. 14.

According to the present invention, when dielectric isolation is formed in the transverse direction, the dielectric body is embedded completely in the isolation grooves only by the low temperature process and the surface is smoothed. Therefore, the projections shaped like birds' beaks and birds' heads, which are formed in the conventional selective oxidation method, are eliminated.

Referring to FIG. 13, the silicon oxide film is formed by the thermal oxidation method on the semiconductor substrate 1 having patterned grooves, and the silicon oxide film 4a and the silicon nitride film 4b may then be formed thereover.

In Examples 2 and 3, the silicon nitride film as the second insulating film is used for smoothing the silicon oxide film as the first insulating film. The silicon nitride film must be all removed by etching. However, when silicon nitride remains, interface charges are generated, cracks tend to form, and the film may peel off.

When the surfaces of the first and second insulating layers are removed under the condition in which the etching rate of silicon oxide differs from that of silicon nitride, the etching rate of silicon nitride for the recessed regions is lower than that for the projecting regions. Thus, when the projecting regions of silicon nitride are all etched, the surface of silicon nitride does not become smooth due to difference in the etching rates of silicon oxide and silicon nitride, resulting in a spike-shaped surface. However, after silicon nitride may be smoothed, the etching rates of the two layers may be controlled to be identical in order to smooth the surface of the first insulating layer.

Examples 1 and 2 describe the effect of the present invention for the insulating layer formed on the first conductive layer, while Example 3 describes the effect for the insulating layer before a conductive layer is formed. The present invention may be applied to any uneven surface formed in manufacturing the semiconductor device.

What we claim is:

1. A method for producing a semiconductor device, comprising the step of forming an insulating film on an uneven surface of a semiconductor body having recesses and projections, the insulating film having recesses and projections corresponding to the recesses and projections of the semiconductor body, and the step of dry-etching said insulating film using a gas containing carbon-halogen bonds and hydrogen as an etchant, whereby the projection portions of the insulating film are etched more quickly than the recess portions and the insulating film is provided with a smooth surface.

2. A method according to claim 1, wherein said dry etching is reactive ion etching.

3. A method according to claim 1, wherein said gas containing carbon-halogen bonds and hydrogen is a gas mixture of $CF_4$, $C_2F_6$, $C_3F_8$, $CCl_4$ or $CF_3Br$ and $H_2$; or $CHF_3$ gas.

4. A method according to claim 1, wherein said gas containing carbon-halogen bonds and hydrogen is a gas mixture of $CF_4$, $C_2F_6$, $C_3F_8$, $CCl_4$ or $CF_3Br$ and $H_2$ in which the volume of $H_2$ is 20 to 40 volume % of the total volume of said gas mixture.

5. A method according to claim 3, wherein said insulating film is a silicon nitride film.

6. A method according to claim 1, wherein said gas containing carbon-halogen bonds and hydrogen is a gas mixture of $CF_4$ and $H_2$, said insulating film being a silicon nitride film.

7. A method according to claim 1, wherein said gas containing carbon-halogen bonds and hydrogen is a gas mixture of $C_3F_8$ and $H_2$, said insulating film being a silicon oxide film.

8. A method according to claim 1, further comprising the steps of forming a first insulating film other than a silicon nitride film on said uneven surface of said semiconductor body; forming a silicon nitride film as a second insulating film; smoothing said silicon nitride film; and etching away all of said second insulating film and the surface of said first insulating film by an etching method in which the etching rate for said first insulating film is substantially the same as that for said second insulation film.

9. A method according to claim 8, wherein said first insulating film is a silicon oxide film.

10. A method according to claim 8, wherein said etching method in which the etching rate for said first insulating film is substantially the same as that for said second insulating film is reactive ion etching.

11. A method for producing a semiconductor device, comprising the step of forming an insulating film on an uneven surface of a semiconductor body having recesses and projections, and the step of applying reactive ion etching to the insulating film, thus depositing polymer in the recesses of the insulating film, whereby the projection portions of the insulating film are etched more quickly than the recess portions and the insulating film is provided with a smooth surface.

12. A method according to claim 1, wherein said dry etching is performed until the top surfaces of the projections of the semiconductor body are exposed.

* * * * *